United States Patent
Shim

(10) Patent No.: US 8,284,614 B2
(45) Date of Patent: Oct. 9, 2012

(54) REFRESH CONTROL CIRCUIT AND METHOD FOR SEMICONDUCTOR MEMORY DEVICE

(75) Inventor: Young-Bo Shim, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 99 days.

(21) Appl. No.: 12/979,642

(22) Filed: Dec. 28, 2010

(65) Prior Publication Data

US 2012/0163106 A1     Jun. 28, 2012

(51) Int. Cl.
*G11C 11/34*     (2006.01)
(52) U.S. Cl. .......... 365/185.25; 365/222; 365/191; 365/233.14
(58) Field of Classification Search .......... 365/185.25, 365/222, 191, 233.14
See application file for complete search history.

(56) References Cited

U.S. PATENT DOCUMENTS

2003/0185079 A1*   10/2003   Takatsuka et al. ........... 365/222
* cited by examiner

*Primary Examiner* — Jason Lappas
(74) *Attorney, Agent, or Firm* — IP & T Group LLP

(57) ABSTRACT

A semiconductor memory device includes a refresh counter for counting a refresh signal and outputting a refresh address in response to an active mode signal enabled in an active mode, an external address input buffer for buffering an external address to output an internal address in response to a mode selection signal enabled in an external address refresh mode, an address selector for outputting the refresh address from the refresh counter as a selection row address in a normal refresh mode and outputting the internal address from the external address input buffer as the selection row address in the external address refresh mode in response to the refresh signal and the mode selection signal, and a row address decoder for generating a row address selection signal for sequentially accessing word lines by decoding the selection row address.

16 Claims, 6 Drawing Sheets

REFRESH CONTROL CIRCUIT AND METHOD FOR SEMICONDUCTOR MEMORY DEVICE

BACKGROUND OF THE INVENTION

Exemplary embodiments of the present invention relate to a semiconductor memory device, and more particularly, to a refresh control circuit and method for a semiconductor memory device.

A memory device, for example, a Dynamic Random Access Memory (DRAM) device, includes a plurality unit cells each of which has one transistor and one capacitor, and data is preliminarily stored in the capacitor. However, since a capacitor formed over a semiconductor substrate is not completely electrically disconnected from its surroundings in a memory device, the data stored in the capacitor may be discharged, and thus, the data may not be retained. In short, leakage current occurs and data of a memory cell may be damaged. To address the problem, the memory device periodically performs a refresh operation to retain the charge which was stored in the capacitor.

A memory device having a refresh operation mode performs a refresh operation while sequentially varying the internal address based on an external command. In other words, when the memory device enters the refresh operation mode based on an external command, a word line of a memory cell is selected as a row address sequentially increases at a predetermined period. The charge stored in the capacitor corresponding to the selected word line is amplified by a sense amplifier and then stored again in the capacitor. Through a series of the refresh process, the stored data is retained without being damaged.

FIG. 1 is a block diagram illustrating a conventional semiconductor memory device for controlling a refresh operation.

As shown in the drawing, the conventional semiconductor memory device 100 for controlling a refresh operation includes a command generator 110, a refresh counter 120, a row address decoder 130, and a cell array 140.

The command generator 110 decodes external commands CSB, RASB, CASB and WEB inputted from the outside of the semiconductor memory device in response to a clock CLK to generate internal commands REF and ACTMD. Herein, the external command "CSB" denotes a chip selection signal, and the external command "RASB" denotes a row address strobe signal. The external command "CASB" denotes a column address strobe signal, and the external command "WEB" denotes a write enable signal. Also, the internal command "REF" denotes a refresh signal, and the internal command "ACTMD" denotes an active mode signal.

The refresh counter 120 counts the refresh signal REF in response to the active mode signal ACTMD outputted from the command generator 110, and outputs a refresh address RA<0:N> so that all the word lines in the cell array 140 are sequentially accessed.

The row address decoder 130 decodes the refresh address RA<0:N> generated in the refresh counter 120 during a refresh operation mode and generates a row address selection signal BX_ADD for selecting a row address to perform a refresh operation.

The cell array 140 retains a stored charge by performing a refresh operation based on the row address selection signal BX_ADD, and thus, prevents data from being lost.

Hereafter, a conventional method for controlling a refresh operation of a semiconductor memory device is described with reference to FIG. 1.

First, the command generator 110 enables the active mode signal ACTMD. Herein, the refresh counter 120 counts the refresh signal REF in response to the active mode signal ACTMD outputted from the command generator 110 and outputs the refresh address RA<0:N>. The row address decoder 130 decodes the refresh address RA<0:N> outputted from the refresh counter 120 and generates the row address selection signal BX_ADD for selecting a row address to perform a refresh operation. Therefore, the cell array 140 retains the stored charge by performing the refresh operation in response to the row address selection signal BX_ADD and prevents the data from being lost. Herein, the refresh operation is performed for one refresh row cycle time tRFC.

The conventional refresh method, however, has a drawback in that it cannot vary the amount of generated noise because it is difficult to change the sequence of refresh addresses. Particularly, since the refresh operation is performed at a period determined based on an average retention time under the assumption that all cells have the same retention time during a test mode, a cell which does not have sufficient retention time loses the data stored therein. This is because, although the cell which does not have sufficient retention time needs to perform the refresh operation at a shorter refresh period than the determined period, the conventional refresh method makes it perform the refresh operation according to the period determined based on the average retention time.

SUMMARY OF THE INVENTION

Exemplary embodiments of the present invention are directed to a refresh control circuit and method for a semiconductor memory device which is capable of varying the amount of generated noise by performing a refresh operation based on an external address in a test mode and changing the sequence of refresh addresses. The refresh control circuit and method is useful for cell screening.

In accordance with an exemplary embodiment of the present invention, a semiconductor memory device includes a refresh counter configured to count a refresh signal and output a refresh address in response to an active mode signal enabled in an active mode, an external address input buffer configured to buffer an external address and output an internal address in response to a mode selection signal enabled in an external address refresh mode, an address selector configured to output the refresh address transferred from the refresh counter as a selection row address in a normal refresh mode and output the internal address transferred from the external address input buffer as the selection row address in the external address refresh mode in response to the refresh signal and the mode selection signal, and a row address decoder configured to generate a row address selection signal for sequentially accessing word lines in a cell array by decoding the selection row address.

In accordance with another exemplary embodiment of the present invention, a method for controlling a refresh operation in a semiconductor memory device includes counting a refresh signal and outputting a refresh address in response to an active mode signal enabled in an active mode, buffering an external address and outputting an internal address in response to a mode selection signal enabled in an external address refresh mode, outputting the refresh address as a selection row address in a normal refresh mode and outputting the internal address as the selection row address in the external address refresh mode in response to the refresh signal and the mode selection signal, and generating a row address selection signal for sequentially accessing word lines in a cell array by decoding the selection row address.

DESCRIPTION OF SPECIFIC EMBODIMENTS

Figure 1:
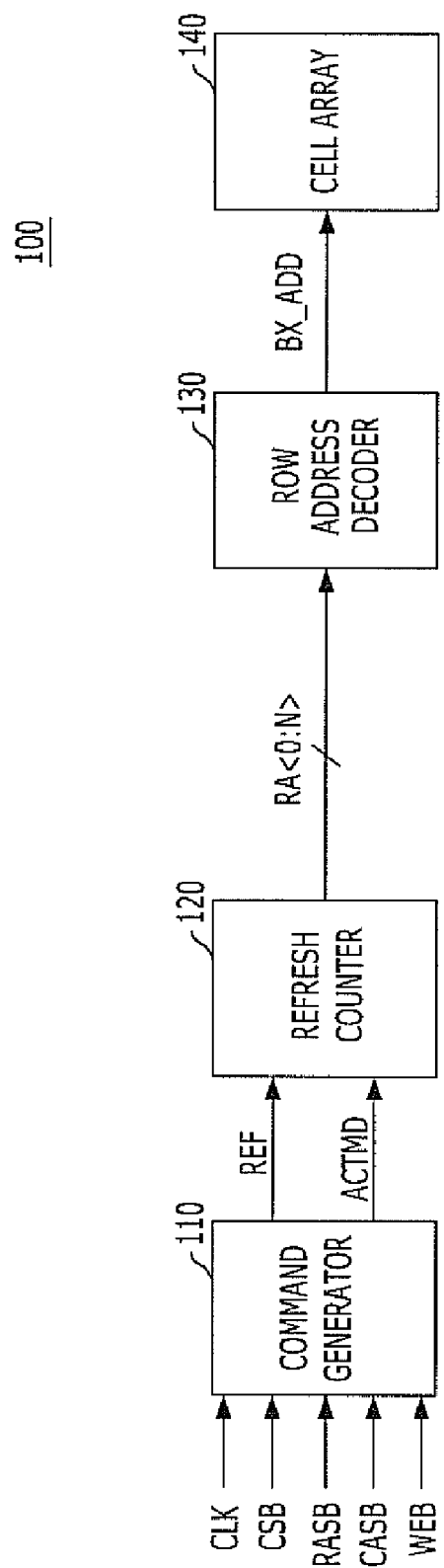
FIG. 1 is a block diagram illustrating a conventional semiconductor memory device for controlling a refresh operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
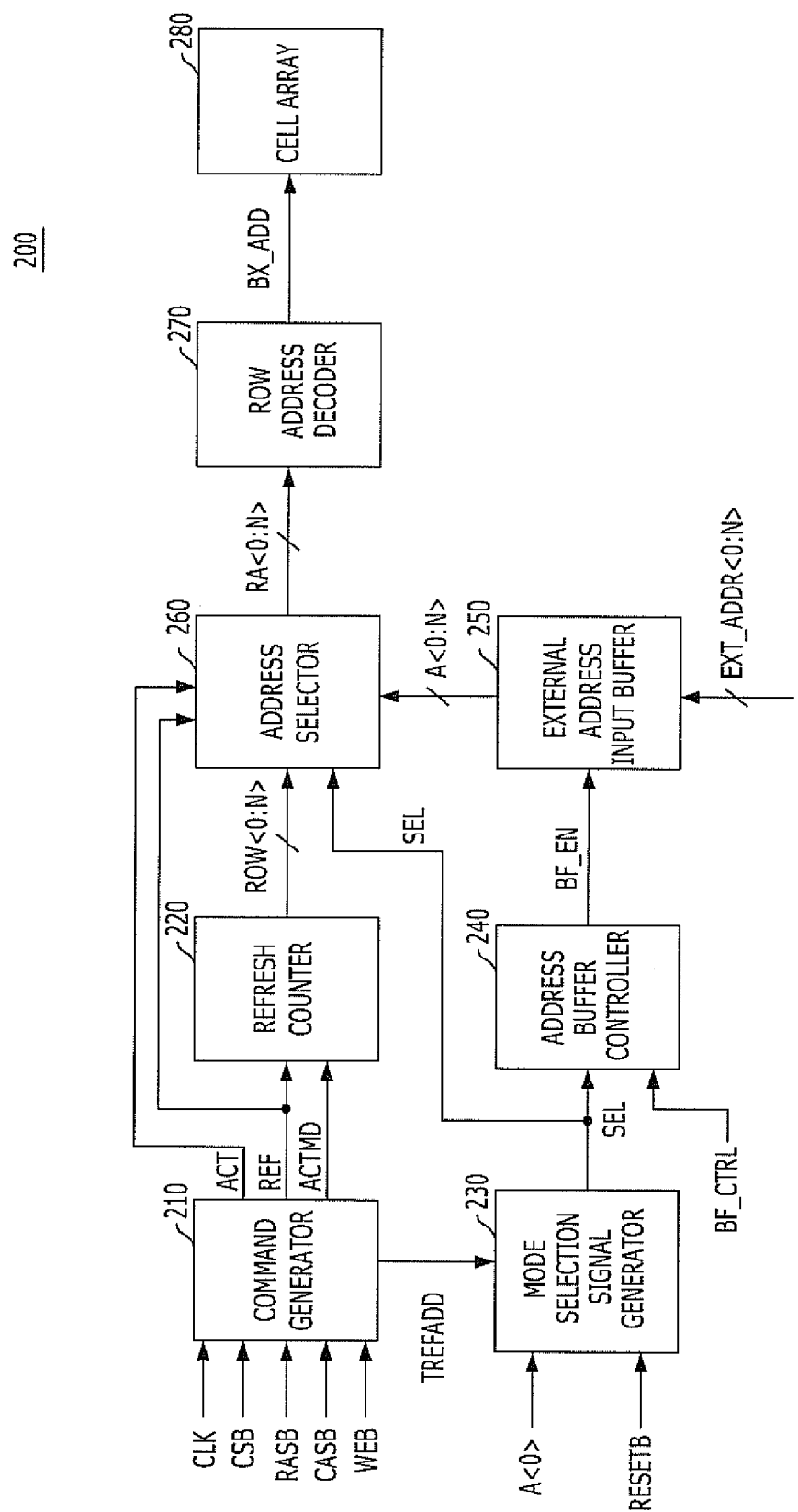
FIG. 2 is a block diagram illustrating a semiconductor memory device for controlling a refresh operation in accordance with an exemplary embodiment of the present invention.

FIG. 2 is a block diagram illustrating a semiconductor memory device for controlling a refresh operation in accordance with an exemplary embodiment of the present invention.

As shown in the drawing, the semiconductor memory device 200 for controlling a refresh operation includes a command generator 210, a refresh counter 220, a mode selection signal generator 230, an address buffer controller 240, an external address input buffer 250, an address selector 260, a row address decoder 270, and a cell array 280.

The command generator 210 decodes external commands CSB, RASB, CASB and WEB inputted from the outside of the semiconductor memory device in response to a clock CLK to generate internal commands REF, ACTMD, ACT and TREFADD. Herein, the external command "CSB" denotes a memory semiconductor chip selection signal, and the external command "RASB" denotes a row address strobe signal, and the external command "RASB" serves as a chip enable signal which initiates the operation of a DRAM device. The external command "CASB" denotes a column address strobe signal and the external command "CASB" indicates whether a column address is applied to the DRAM device. The external command "WEB" denotes a write enable signal and it decides whether to write or read a data.

Also, among the internal commands, the internal command "REF" denotes a refresh signal, and the internal command "ACTMD" denotes an active mode signal. The internal command "ACT" denotes an enabled duration setup signal. The internal command "TREFADD" denotes a test mode signal. The refresh signal REF is a signal enabled during a refresh operation, and the active mode signal ACTMD is a signal enabled during an active mode of the semiconductor memory device. The test mode signal TREFADD is a signal enabled during a test mode. The enabled duration setup signal ACT is a pulse signal enabled to a logic low level for a predetermined duration when an active command is input in an active mode of the semiconductor memory device.

The refresh counter 220 counts the refresh signal REF in response to the active mode signal ACTMD outputted from the command generator 210, and outputs a refresh address ROW<0:N> so that all the word lines in the cell array 280 are sequentially accessed.

The mode selection signal generator 230 generates a mode selection signal SEL for determining whether to enter an external address refresh mode or not based on the test mode signal TREFADD provided by the command generator 210 and a particular bit of an internal address A<0:N> generated from an external address EXT_ADDR<0:N>, for example, a first internal address A<0>. According to an exemplary embodiment of the present invention, the mode selection signal generator 230 may be formed using a mode register set (MRS) of a semiconductor memory device. Herein, the external address refresh mode is a mode where a refresh operation is performed by receiving the external address after entering the test mode.

The address buffer controller 240 outputs a buffer enable signal BF_EN for enabling the external address input buffer 250 in response to the mode selection signal SEL provided by the mode selection signal generator 230 and a buffer control signal BF_CTRL. Herein, the buffer enable signal BF_EN disables the external address input buffer 250 in a normal refresh mode.

The external address input buffer 250 is enabled upon receipt of the buffer enable signal BF_EN outputted from the address buffer controller 240 and it outputs an internal address A<0:N> by receiving the external address EXT_ADDR<0:N>.

The address selector 260 outputs the refresh address ROW<0:N> transferred from the refresh counter 220 as a selection row address RA<0:N> in the normal refresh mode, and outputs the internal address A<0:N> transferred from the external address input buffer 250 as the selection row address RA<0:N> in the test mode in response to the mode selection signal SEL outputted from the mode selection signal generator 230, the refresh signal REF and the enabled duration setup signal ACT which are outputted from the command generator 210.

The row address decoder 270 decodes the selection row address RA<0:N> outputted from the address selector 260 and generates a row address selection signal BX_ADD.

The cell array 280 retains a stored charge by performing a refresh operation based on the row address selection signal BX_ADD, and thus, prevents data from being lost.

Figure 3A:
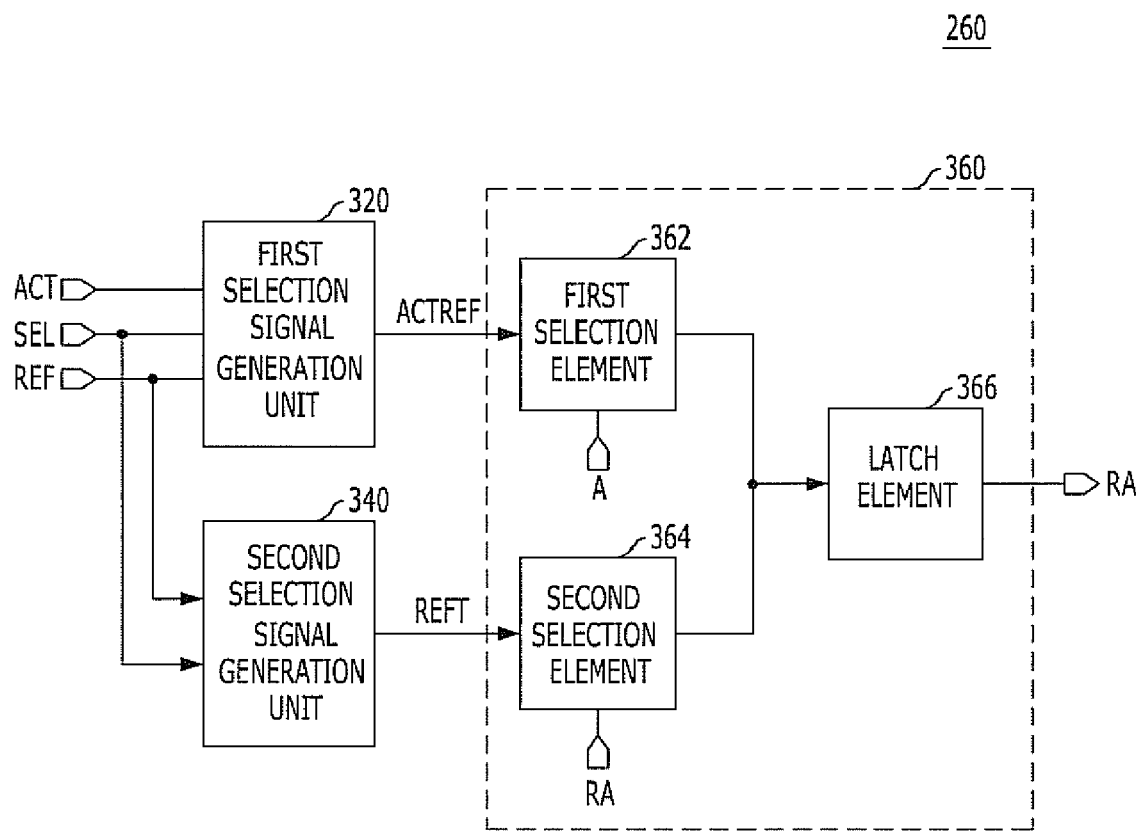
FIG. 3A is a block diagram of an address selector 260 shown in FIG. 2.

FIG. 3A is a block diagram of the address selector 260 shown in FIG. 2.

Referring to FIG. 3A, the address selector 260 according to an exemplary embodiment of the present invention includes a first selection signal generation unit 320, a second selection signal generation unit 340, and a selection row address output unit 360.

The first selection signal generation unit 320 receives the mode selection signal SEL, the enabled duration setup signal ACT, and the refresh signal REF and generates a first selection signal ACTREF. The first selection signal ACTREF is a signal for outputting the internal address A<0:N> outputted from the external address input buffer 250 as the selection row address RA<0:N>.

The second selection signal generation unit 340 receives the mode selection signal SEL and the refresh signal REF and generates a second selection signal REFT. The second selection signal REFT is a signal for outputting the refresh address ROW<0:N> outputted from the refresh counter 220 as the selection row address RA<0:N>.

The selection row address output unit 360 includes a first selection element 362, a second selection element 364, and a latch element 366. The first selection element 362 outputs the internal address A<0:N> in response to the enabling of the first selection signal ACTREF. The second selection element 364 outputs the refresh address ROW<0:N> in response to the enabling of the second selection signal REFT. The latch element 366 latches an output of the first selection element 362 or an output of the second selection element 364 and outputs it as the selection row address RA<0:N>.

Figure 3B:
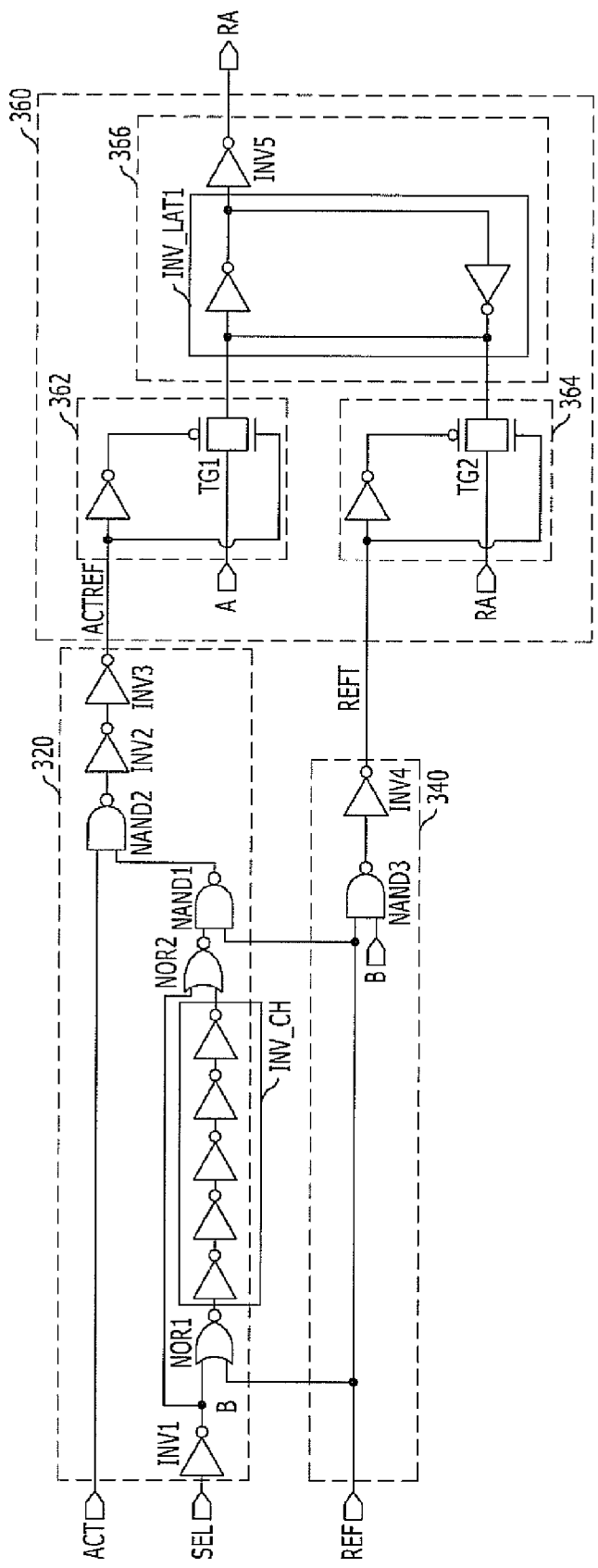
FIG. 3B is a detailed circuit diagram of the address selector 260 shown in FIG. 2.

FIG. 3B is a detailed circuit diagram of the address selector 260 shown in FIG. 2.

Referring to FIG. 3B, the first selection signal generation unit 320 in accordance with an exemplary embodiment of the present invention includes a first inverter INV1, a second inverter INV2, a third inverter INV3, a first NOR gate NOR1, a second NOR gate NOR2, a first NAND gate NAND1, a second NAND gate NAND2, and an inverter chain INV_CH.

The first inverter INV1 inverts the mode selection signal SEL and outputs the inverted mode selection signal to a node B. The first NOR gate NOR1 performs a logic operation onto a signal of the node B and the refresh signal REF, and outputs a result. The inverter chain INV_CH delays the output of the first NOR gate NOR1 for a predetermined time. The second NOR gate NOR2 performs a logic operation onto the signal of the node B and an output of the inverter chain INV_CH, and outputs a result. The first NAND gate NAND1 performs a logic operation onto the refresh signal REF and an output of the second NOR gate NOR2, and outputs a result. The second NAND gate NAND2 performs a logic operation onto the enabled duration setup signal ACT and an output of the first NAND gate NAND1. The second inverter INV2 and the third inverter INV3 buffer an output of the second NAND gate NAND2, and finally output the first selection signal ACTREF.

The first selection signal generation unit 320 in accordance with an exemplary embodiment of the present invention enables the first selection signal ACTREF in response with the enabled duration setup signal ACT, which is a pulse signal enabled to a logic low level for a predetermined duration when an active command is input in an active mode of the semiconductor memory device. Accordingly, the semiconductor memory device may perform an external address refresh operation by using the internal address A<0:N> at initial of the active mode.

Further, the first selection signal generation unit 320 in accordance with an exemplary embodiment of the present invention disables the first selection signal ACTREF in response to the enabled duration setup signal ACT, which is disabled to a logic high level, and the mode selection signal SEL, which is disabled to a logic low level. Also, when the mode selection signal SEL is enabled to a logic high level, that is, in the external address refresh mode, the first selection signal generation unit 320 selectively enables the first selection signal ACTREF in response to the refresh signal REF. Therefore, in the external address refresh mode, the first selection signal generation unit 320 may perform an external address refresh operation by using the internal address A<0:N>.

The second selection signal generation unit 340 includes a third NAND gate NAND3 and a fourth inverter INV4. The third NAND gate NAND3 and the fourth inverter INV4 performs an AND operation onto the refresh signal REF and an inverted signal of the mode selection signal SEL, which is a signal of the node B, and finally outputs the second selection signal REFT.

The second selection signal generation unit 340 in accordance with an exemplary embodiment of the present invention selectively enables the second selection signal REFT in response to the refresh signal REF in the normal refresh mode where the mode selection signal SEL is disabled to a logic low level. Also, the second selection signal generation unit 340 in accordance with an exemplary embodiment of the present invention disables the second selection signal REFT to a logic low level all the time and outputs a disabled second selection signal REFT in response to the signal of the node B, which is of a logic low level and inputted to the third NAND gate NAND3, in the external address refresh mode where the mode selection signal SEL is enabled to a logic high level, regardless of the logic level of the refresh signal REF. Therefore, it is possible to perform a normal refresh operation in the normal refresh mode by using the refresh address ROW<0:N> outputted from the refresh counter 220.

The first selection element 362 of the selection row address output unit 360 includes a first transfer gate TG1 which is turned on/off according to the first selection signal ACTREF. The second selection element 364 of the selection row address output unit 360 includes a second transfer gate TG2 which is turned on/off according to the second selection signal REFT. The latch element 366 of the selection row address output unit 360 includes a first inverter latch INV_LAT1 and a fifth inverter INV5 and latches the outputs of the first selection element 362 and the second selection element 364.

Figure 4:
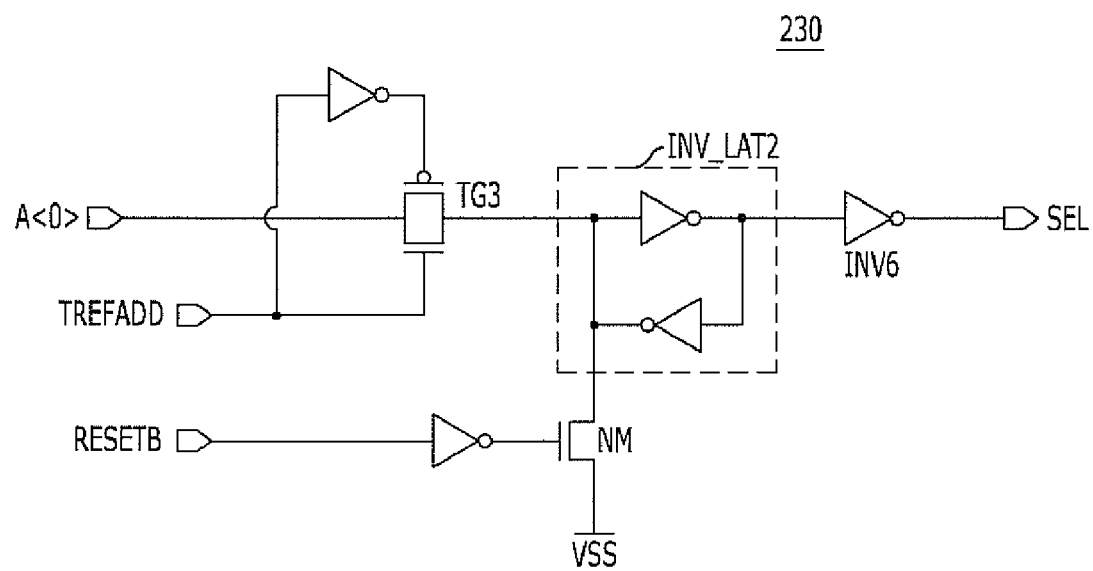
FIG. 4 is a detailed circuit diagram of a mode selection signal generator 230 shown in FIG. 2.

FIG. 4 is a detailed circuit diagram of the mode selection signal generator 230 shown in FIG. 2.

Referring to the drawing, the mode selection signal generator 230 according to an exemplary embodiment of the present invention includes a third transfer gate TG3, a second inverter latch INV_LAT2, and a sixth inverter INV6.

The third transfer gate TG3 transfers a first internal address A<0> outputted from the external address input buffer 250 in response to the test mode signal TREFADD. The second inverter latch INV_LAT2 and the sixth inverter INV6 latch an output signal of the third transfer gate TG3 and output the mode selection signal SEL.

Also, the mode selection signal generator 230 according to an exemplary embodiment of the present invention may further include a transistor NM for initializing the mode selection signal SEL in response to a reset signal RESETB.

As described above, when the test mode signal TREFADD is enabled to a logic high level, the mode selection signal generator 230 according to an exemplary embodiment of the present invention outputs the received internal address <A:0> as the mode selection signal SEL.

Figure 5:
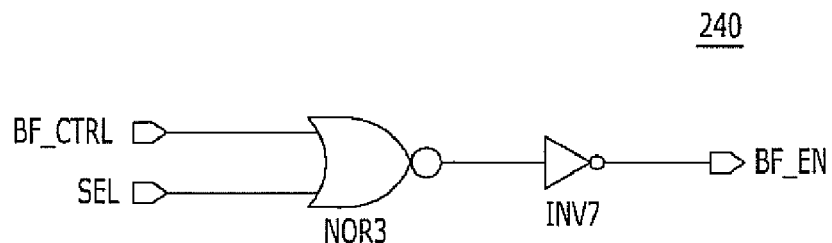
FIG. 5 is a detailed circuit diagram of an address buffer controller 240 shown in FIG. 2.

FIG. 5 is a detailed circuit diagram of the address buffer controller 240 shown in FIG. 2.

Referring to FIG. 5, the address buffer controller 240 according to an exemplary embodiment of the present invention includes a third NOR gate NOR3 and a seventh inverter INV7, and it performs an OR operation onto the mode selection signal SEL, outputted from the mode selection signal generator 230, and a buffer control signal BF_CTRL.

The buffer control signal BF_CTRL is disabled to a logic low level in the normal refresh mode and disables the external address input buffer 250. Therefore, the address buffer controller 240 outputs a buffer enable signal BF_EN of a logic low level, as the buffer control signal BF_CTRL and the mode selection signal SEL are all disabled to logic low levels in the normal refresh mode. On the other hand, when the mode is not the active mode, the buffer control signal BF_CTRL is enabled to a logic high level. Thus, the address buffer controller 240 outputs a buffer enable signal BF_EN of a logic high level, regardless of the mode selection signal SEL. Also, in the external address refresh mode, the address buffer controller 240 outputs a buffer enable signal BF_EN of a logic high level, regardless of the logic level of the buffer control signal BF_CTRL, because the mode selection signal SEL is enabled to a logic high level.

Figure 6:
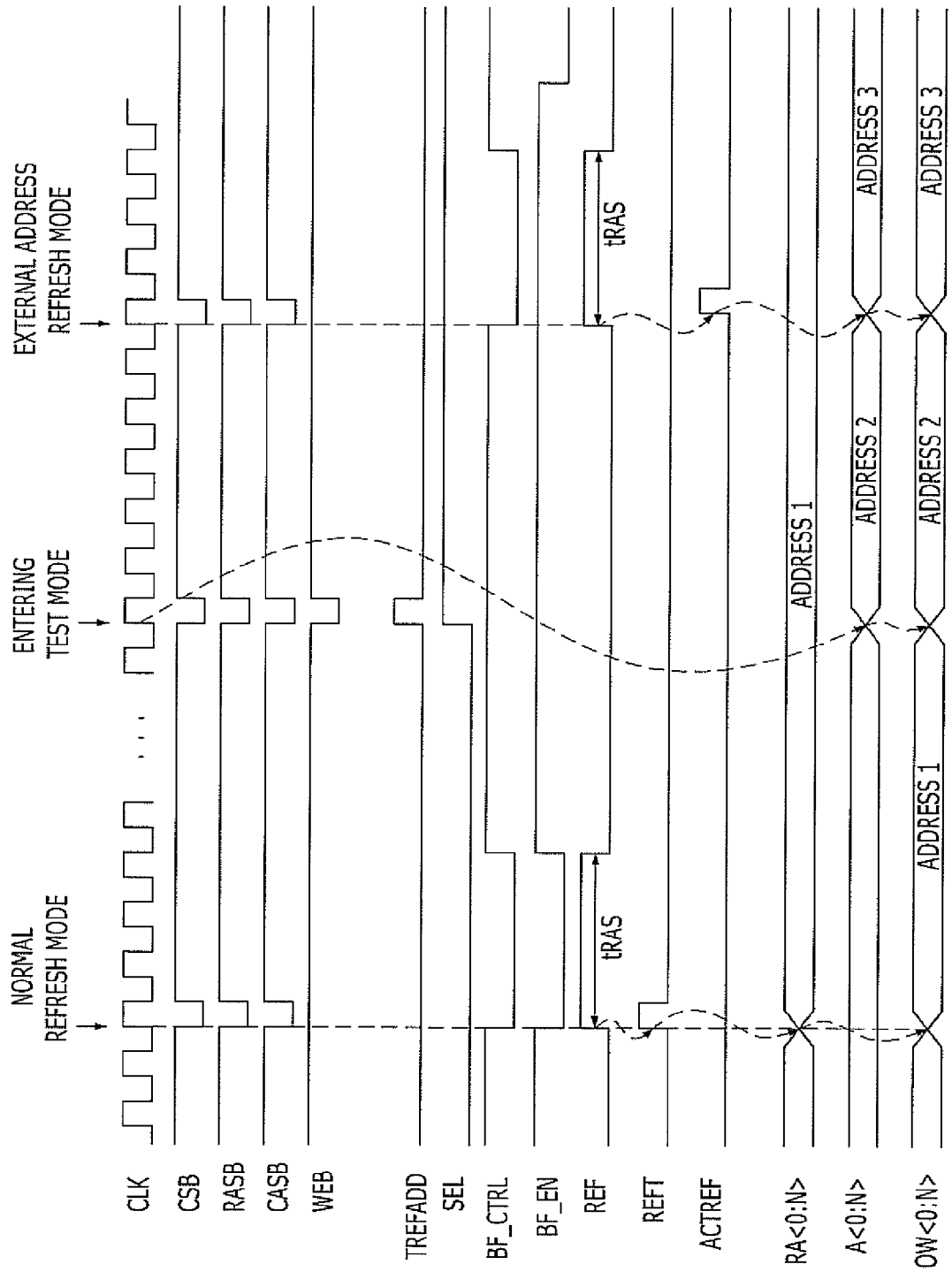
FIG. 6 is a timing diagram describing a refresh operation controlling method of the semiconductor memory device in accordance with an exemplary embodiment of the present invention.

FIG. 6 is a timing diagram describing a refresh operation controlling method of the semiconductor memory device in accordance with an exemplary embodiment of the present invention.

Hereafter, a method of controlling a refresh operation in the semiconductor memory device fabricated according to an exemplary embodiment of the present invention is described with reference to FIGS. 2 to 6.

First, in a normal refresh mode, the command generator 210 decodes external commands CSB, RASB, CASB and WEB inputted from the outside and disables a test mode signal TREFADD to a logic low level, and disables a mode selection signal SEL to logic low levels.

The first selection signal generation unit 320 disables a first selection signal ACTREF to a logic low level and outputs a disabled first selection signal in response to the enabled duration setup signal ACT of a logic high level and the mode selection signal SEL of a logic low level. Meanwhile, the second selection signal generation unit 340 selectively enables a second selection signal REFT and outputs an enabled second selection signal in response to a refresh signal REF when the mode selection signal SEL is at a logic low level.

Subsequently, when the refresh signal REF for a refresh operation is enabled to a logic high level, the second selection signal REFT is enabled to a logic high level too. Accordingly, the second selection element 364 of the selection row address output unit 360 is enabled and selects a refresh address ROW<0:N> outputted from the refresh counter 220 and outputs it as a selection row address RA<0:N>. The row address decoder 270 generates a row address selection signal BX_ADD by decoding the selection row address RA<0:N>, and the cell array 280 performs a normal refresh operation in response to the row address selection signal BX_ADD.

Next, the command generator 210 enables the test mode signal TREFADD to a logic high level by decoding the external commands CSB, RASB, CASB and WEB inputted from the outside in response to the clock CLK. Upon receipt of the test mode signal TREFADD of a logic high level, the mode selection signal SEL is transferred by latching a received first internal address A<0>. Herein, since the mode selection signal SEL is enabled to a logic high level, the unit cell enters the external address refresh mode.

Since the mode selection signal SEL is enabled to a logic high level, the address buffer controller 240 enables and outputs a buffer enable signal BF_EN regardless of the logic level of a buffer control signal BF_CTRL. Also, the second selection signal generation unit 340 disables the second selection signal REFT to a logic low level and outputs a disabled second selection signal all the time, regardless of a refresh operation. Meanwhile, when the mode selection signal SEL is enabled to a logic high level, the first selection signal generation unit 320 selectively enables the first selection signal ACTREF in response to the refresh signal REF.

Subsequently, when the refresh signal REF for a refresh operation is enabled to a logic high level, the first selection signal generation unit 320 enables the first selection signal ACTREF to a logic high level for a determined duration.

As a result, the first selection element 362 of the selection row address output unit 360 is enabled, and therefore, it selects an internal address A<0:N> inputted from the outside through the external address input buffer 250 and outputs the selection row address RA<0:N>. The row address decoder 270 generates a row address selection signal BX_ADD by decoding the selection row address RA<0:N>, and performs an external address refresh operation in response to the row address selection signal BX_ADD.

According to the technology of the present invention, which is described above, a semiconductor memory device performs a refresh operation in the normal refresh mode by using a refresh address ROW<0:N> outputted from the refresh counter 220, and it performs the refresh operation in the external address refresh mode by not receiving a refresh address outputted from the refresh counter, and instead uses an external address inputted from the outside.

The technology of the present invention described above is capable of varying the amount of generated noise by performing a refresh operation based on an external address and changing the sequence of refresh addresses in a test mode. Thus, the technology of the present invention is useful for cell screening.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a refresh counter configured to count a refresh signal and output a refresh address in response to an active mode signal enabled in an active mode;
   an external address input buffer configured to buffer an external address and output an internal address in response to a mode selection signal enabled in an external address refresh mode;
   an address selector configured to output the refresh address transferred from the refresh counter as a selection row address in a normal refresh mode and output the internal address transferred from the external address input buffer as the selection row address in the external address refresh mode in response to the refresh signal and the mode selection signal; and
   a row address decoder configured to generate a row address selection signal for sequentially accessing word lines in a cell array by decoding the selection row address.

2. The semiconductor memory device of claim 1, further comprising:
   a command generator configured to generate the refresh signal, the active mode signal, and a test mode signal by decoding an external command in response to a clock; and
   a mode selection signal generator configured to output a particular bit of the internal address as the mode selection signal in response to the test mode signal provided by the command generator.

3. The semiconductor memory device of claim 2, wherein the mode selection signal generator comprises:
   a transfer gate unit for transferring a predetermined bit of the internal address outputted from the external address input buffer in response to the test mode signal; and
   a latch unit for latching an output signal of the transfer gate unit and outputting the latched output signal as the mode selection signal.

4. The semiconductor memory device of claim 1, further comprising:

an address buffer controller configured to output a buffer enabled signal for enabling or disabling the external address input buffer in response to the mode selection signal and a buffer control signal,
wherein the buffer enabled signal disables the external address input buffer in the normal refresh mode.

5. The semiconductor memory device of claim 4, wherein the address buffer controller comprises:
a logic gate unit for performing an AND operation onto the mode selection signal and the buffer control signal.

6. The semiconductor memory device of claim 1, wherein the address selector comprises:
a first selection signal generation unit for generating a first selection signal for outputting the internal address outputted from the external address input buffer as the selection row address in response to the mode selection signal, an enabled duration setup signal which is a pulse signal enabled in an active mode, and the refresh signal;
a second selection signal generation unit for generating a second selection signal for outputting the refresh address outputted from the refresh counter as the selection row address in response to the mode selection signal and the refresh signal; and
a selection row address output unit for outputting the internal address or the refresh address as the selection row address in response to the first selection signal and the second selection signal.

7. The semiconductor memory device of claim 6, wherein in the external address refresh mode where the mode selection signal is enabled,
the first selection signal generation unit selectively enables the first selection signal in response to the refresh signal and the enabled duration setup signal, and
the second selection signal generation unit disables the second selection signal.

8. The semiconductor memory device of claim 6, wherein in the normal refresh mode where the mode selection signal is disabled,
the first selection signal generation unit disables the first selection signal, and
the second selection signal generation unit selectively enables the second selection signal in response to the refresh signal.

9. The semiconductor memory device of claim 6, wherein the first selection signal generation unit comprises:
a first logic gate for inverting the mode selection signal and outputting an inverted mode selection signal to a node;
a second logic gate for performing a NOR operation onto a signal of the node and the refresh signal;
an inverter chain for delaying an output of the second logic gate for a predetermined time;
a third logic gate for performing a NOR operation onto the signal of the node and an output of the inverter chain;
a fourth logic gate for performing a NAND operation onto the refresh signal and an output of the third logic gate;
a fifth logic gate for performing a NAND operation onto an output of the fourth logic gate and the enabled duration setup signal; and
a sixth logic gate for buffering an output of the fifth logic gate and outputting an operation result value as the first selection signal.

10. The semiconductor memory device of claim 6, wherein the second selection signal generator comprises:

a logic gate for performing an AND operation onto the refresh signal and the inverted mode selection signal.

11. The semiconductor memory device of claim 6, wherein the selection row address output unit comprises:
a first selection element for outputting the internal address in response to enabling of the first selection signal;
a second selection element for outputting the refresh address in response to enabling of the second selection signal; and
a latch element for latching an output of the first selection element or an output of the second selection element and outputting a latched output as the selection row address.

12. A method for controlling a refresh operation in a semiconductor memory device, comprising:
counting a refresh signal and outputting a refresh address in response to an active mode signal enabled in an active mode;
buffering an external address and outputting an internal address in response to a mode selection signal enabled in an external address refresh mode;
outputting the refresh address as a selection row address in a normal refresh mode and outputting the internal address as the selection row address in the external address refresh mode in response to the refresh signal and the mode selection signal; and
generating a row address selection signal for sequentially accessing word lines in a cell array by decoding the selection row address.

13. The method of claim 12, further comprising:
generating the refresh signal, the active mode signal, and a test mode signal by decoding an external command in response to a clock; and
outputting the mode selection signal in response to the test mode signal.

14. The method of claim 12, wherein the outputting of the refresh address as a selection row address in a normal refresh mode and the outputting of the internal address as the selection row address in the external address refresh mode in response to the refresh signal and the mode selection signal comprises:
generating a first selection signal for outputting the internal address as the selection row address in response to the mode selection signal, an enabled duration setup signal, which is a pulse signal enabled in an active mode, and the refresh signal;
generating a second selection signal for outputting the refresh address as the selection row address in response to the mode selection signal and the refresh signal; and
outputting the internal address or the refresh address as the selection row address in response to the first selection signal and the second selection signal.

15. The method of claim 14, wherein in the external address refresh mode where the mode selection signal is enabled,
the first selection signal is selectively enabled and outputted in response to the refresh signal and the enabled duration setup signal, and
the second selection signal is disabled and outputted.

16. The method of claim 14, wherein in the normal refresh mode where the mode selection signal is disabled,
the first selection signal is disabled and outputted, and
the second selection signal is selectively enabled and outputted in response to the refresh signal.

* * * * *